US012787357B2

(12) United States Patent
Lu et al.

(10) Patent No.: US 12,787,357 B2
(45) Date of Patent: Nov. 3, 2026

(54) THIN-FILM TRANSISTOR HAVING A SOURCE/DRAIN REGION BENEATH A GATE AND A SOURCE ELECTRODE ON A DIFFERENT LAYER FROM A DRAIN ELECTRODE, DISPLAY PANEL COMPRISING THE SAME, AND MANUFACTURING METHOD OF THE DISPLAY PANEL

(71) Applicant: TCL CHINA STAR OPTOELECTRONICS TECHNOLOGY CO., LTD., Shenzhen (CN)

(72) Inventors: Macai Lu, Shenzhen (CN); Minggang Liu, Shenzhen (CN); Nian Liu, Shenzhen (CN)

(73) Assignee: TCL CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 1313 days.

(21) Appl. No.: 17/611,118

(22) PCT Filed: Sep. 29, 2021

(86) PCT No.: PCT/CN2021/121819

§ 371 (c)(1),
(2) Date: Mar. 30, 2023

(87) PCT Pub. No.: WO2023/044950

PCT Pub. Date: Mar. 30, 2023

(65) Prior Publication Data

US 2024/0047537 A1 Feb. 8, 2024

(30) Foreign Application Priority Data

Sep. 24, 2021 (CN) .......................... 202111120728.4

(51) Int. Cl.
*H10D 30/67* (2025.01)
*G02F 1/1362* (2006.01)
(Continued)

(52) U.S. Cl.
CPC ... *H10D 30/6729* (2025.01); *G02F 1/136286* (2013.01); *G02F 1/1368* (2013.01);
(Continued)

(58) Field of Classification Search
CPC ........... H10D 30/6729; H10D 30/0321; H10D 30/6755; H10D 30/6734; H10D 86/441;
(Continued)

(56) References Cited

U.S. PATENT DOCUMENTS

2016/0181344 A1 6/2016 Seo et al.
2016/0334909 A1* 11/2016 Zhang ................ G02F 1/13338
(Continued)

FOREIGN PATENT DOCUMENTS

CN 111584521 A 8/2020
CN 111682033 A 9/2020
(Continued)

OTHER PUBLICATIONS

Chinese Office Action issued in corresponding Chinese Patent Application No. 202111120728.4 dated May 25, 2024, pp. 1-8.
(Continued)

*Primary Examiner* — Eliseo Ramos Feliciano
*Assistant Examiner* — Brad A Knudson
(74) *Attorney, Agent, or Firm* — PV IP PC; Christopher S. Ruprecht; Wei Te Chung

(57) ABSTRACT

A thin-film transistor (TFT), a display panel, and a manufacturing method of the display panel are provided. The TFT includes: a gate, a gate insulating layer, an active layer, a first electrode, an interlayer insulating layer, and a second electrode. The interlayer insulating layer is disposed between the
(Continued)

first electrode and the active layer. A first via is defined on the interlayer insulating layer. The active layer is connected to the first electrode by the first via. A thickness of the interlayer insulating layer is greater than a thickness of the gate insulating layer. The second electrode is connected to the active layer.

20 Claims, 5 Drawing Sheets

(51) Int. Cl.
*G02F 1/1368* (2006.01)
*H10D 86/40* (2025.01)
*H10D 86/60* (2025.01)

(52) U.S. Cl.
CPC ..... *H10D 30/6713* (2025.01); *H10D 30/6755* (2025.01); *H10D 86/423* (2025.01); *H10D 86/60* (2025.01)

(58) Field of Classification Search
CPC ................ H10D 86/60; H10D 30/6713; G02F 1/136286; G02F 1/1368
See application file for complete search history.

(56) References Cited

U.S. PATENT DOCUMENTS

| | | | | |
|---|---|---|---|---|
| 2017/0294464 | A1* | 10/2017 | Kwon | H10D 30/6755 |
| 2019/0006521 | A1* | 1/2019 | Noh | H10D 30/6713 |
| 2020/0096799 | A1 | 3/2020 | Zhou et al. | |
| 2020/0387019 | A1 | 12/2020 | Maeda et al. | |
| 2021/0183899 | A1 | 6/2021 | Imai et al. | |
| 2021/0200045 | A1* | 7/2021 | Morinaga | G09G 3/3648 |

FOREIGN PATENT DOCUMENTS

| | | | |
|---|---|---|---|
| CN | 112490254 | A | 3/2021 |
| CN | 113345837 | A | 9/2021 |
| JP | 2016178297 | A | 10/2016 |
| JP | 2018181890 | A | 11/2018 |
| JP | 2019040026 | A | 3/2019 |
| JP | 2021105638 | A | 7/2021 |
| JP | 2021108366 | A | 7/2021 |
| WO | 2014012334 | A1 | 1/2014 |
| WO | 2015194176 | A1 | 12/2015 |
| WO | 2018197988 | A1 | 11/2018 |

OTHER PUBLICATIONS

Japanese Office Action issued in corresponding Japanese Patent Application No. 特願 2021-560071 dated Aug. 5, 2024, pp. 1-3.
International Search Report in International application No. PCT/CN2021/121819, mailed on May 25, 2022.
Written Opinion of the International Search Authority in International application No. PCT/CN2021/121819, mailed on May 25, 2022.
Japanese Office Action issued in corresponding Japanese Patent Application No. 特願 2021-560071 dated Feb. 5, 2024, pp. 1-5.
European Office Action issued in corresponding European Patent Application No. 21801407.4 dated Jul. 7, 2025, pp. 1-8.
Japanese Office Action issued in corresponding Japanese Patent Application No. 特願 2021-560071 dated Jul. 29, 2025, pp. 1-8.

* cited by examiner

THIN-FILM TRANSISTOR HAVING A SOURCE/DRAIN REGION BENEATH A GATE AND A SOURCE ELECTRODE ON A DIFFERENT LAYER FROM A DRAIN ELECTRODE, DISPLAY PANEL COMPRISING THE SAME, AND MANUFACTURING METHOD OF THE DISPLAY PANEL

RELATED APPLICATIONS

This application is a Notional Phase of PCT Patent Application No. PCT/CN2021/121819 having international filing date of Sep. 29, 2021, which claims the benefit of priority of Chinese Patent Application No. 202111120728.4 filed on Sep. 24, 2021. The contents of the above applications are all incorporated by reference as if fully set forth herein in their entirety.

FIELD

The present disclosure relates to a field of display technologies, and more particularly, to a thin-film transistor (TFT), a display panel, and a manufacturing method of the display panel.

BACKGROUND

In conventional back-channel etched (BCE) TFTs, to improve electrical performance, a Vgs voltage needs to be reduced as much as possible. Specifically, this can be realized by reducing a thickness of a gate insulating layer. However, reducing the thickness of the gate insulating layer not only reduces a pressure resistance between a gate and a drain but also increases capacitance between the gate and a source/drain, affecting comprehensive electrical performance of the TFTs.

SUMMARY

Embodiments of the present disclosure provide a TFT, a display panel, and a manufacturing method of the display panel to effectively improve comprehensive electrical performance of TFTs.

An embodiment of the present disclosure provides a TFT, comprising: a gate; a gate insulating layer disposed on a side of the gate; an active layer disposed on a side of the gate insulating layer away from the gate and disposed opposite to the gate; a first electrode disposed on a side of the active layer away from the gate; and an interlayer insulating layer disposed between the first electrode and the active layer to insulate the first electrode from the active layer, a first via penetrating the interlayer insulating layer and extending to a surface of the first electrode is defined on the interlayer insulating layer, the active layer is connected to the first electrode by the first via, and a thickness of the interlayer insulating layer is greater than a thickness of the gate insulating layer; and a second electrode connected to the active layer. The second electrode and the active layer are disposed on a same layer.

Optionally, in some specific embodiments of the present disclosure, the TFT further comprises: an auxiliary electrode disposed opposite to the active layer, wherein the interlayer insulating layer is disposed between the auxiliary electrode and the active layer.

Optionally, in some specific embodiments of the present disclosure, the first electrode and the auxiliary electrode are disposed on a same layer, and the active layer is connected to the first electrode by the first via.

Optionally, in some specific embodiments of the present disclosure, the active layer comprises a semiconductor part and a first electrode contact part, conductivity of the first electrode contact part is less than conductivity of the first electrode, and the conductivity of the first electrode contact part is greater than conductivity of the semiconductor part; and the first electrode contact part is connected to the first electrode by the first via.

An embodiment of the present disclosure further provides a display panel, comprising: a first electrode disposed on a first metal layer; an interlayer insulating layer disposed on the first electrode, wherein a first via penetrating the interlayer insulating layer and extending to a surface of the first electrode is defined on the interlayer insulating layer; an active layer disposed on the interlayer insulating layer, wherein the active layer is connected to the first electrode by the first via; a second electrode connected to the active layer; a gate insulating layer disposed on the active layer; and a gate disposed on a second metal layer disposed on the gate insulating layer, wherein the gate is disposed opposite to the active layer. A thickness of the interlayer insulating layer is greater than a thickness of the gate insulating layer.

Optionally, in some specific embodiments of the present disclosure, the display panel further comprises: an auxiliary electrode disposed opposite to the active layer, wherein the interlayer insulating layer is disposed between the auxiliary electrode and the active layer. The first electrode is a drain and the second electrode is a source; and/or the first electrode is the source and the second electrode is the drain.

Optionally, in some specific embodiments of the present disclosure, the auxiliary electrode is disposed on the first metal layer, and the interlayer insulating layer covers the first electrode and the auxiliary electrode.

Optionally, in some specific embodiments of the present disclosure, the active layer comprises a semiconductor part and a first electrode contact part, conductivity of the first electrode contact part is less than conductivity of the first electrode, and the conductivity of the first electrode contact part is greater than conductivity of the semiconductor part; and the first electrode contact part is connected to the first electrode by the first via.

Optionally, in some specific embodiments of the present disclosure, the display panel further comprises a pixel electrode, wherein the pixel electrode and the active layer are disposed on a same layer, the pixel electrode is electrically connected to the active layer, and the active layer comprises a metal oxide semiconductor.

Optionally, in some specific embodiments of the present disclosure, the display panel further comprises: a substrate, wherein the first metal layer is disposed on the substrate and comprises a plurality of data lines; a plurality of scan lines disposed on the second metal layer, wherein the scan lines cross the data lines to define a plurality of sub-pixel units, and the gate, the second electrode, a thin-film transistor (TFT) composed of the first electrode, the second electrode, the first electrode, and the active layer and the pixel electrode connected to the TFT are disposed in the sub-pixel units; a passivation layer disposed on the second metal layer and covering the gate and the pixel electrode; and a common electrode disposed on the passivation layer and disposed opposite to the pixel electrode.

Optionally, in some specific embodiments of the present disclosure, a lateral edge of the gate, a lateral edge of the gate insulating layer, and a lateral edge of the semiconductor part of the active layer are aligned with each other.

Optionally, in some specific embodiments of the present disclosure, the thickness of the interlayer insulating layer is greater than or equal to two times the thickness of the gate insulating layer.

Optionally, in some specific embodiments of the present disclosure, the first metal layer further comprises a touch control signal line; and the display panel further comprises: a first touch control electrode, wherein the first touch control electrode and the active layer are disposed on a same layer, and the first touch control electrode is connected to the active layer; and a second touch control electrode, wherein the second touch control electrode is insulated from the first touch control electrode and is disposed opposite to the first touch control electrode.

An embodiment of the present disclosure further provides a method of manufacturing the display panel, comprising following steps:

B1, providing a substrate;

B2, forming a first metal layer on the substrate, and patterning the first metal layer to form a first electrode;

B3, disposing an interlayer insulating layer on the first metal layer, and patterning the interlayer insulating layer to form a first via;

B4, disposing a patterned active layer on the interlayer insulating layer, wherein the active layer is connected to the first electrode by the first via, and the active layer comprises a metal oxide semiconductor;

B5, forming a gate insulating layer and a second metal layer on the active layer, and a thickness of the interlayer insulating layer is greater than or equal to two times a thickness of the gate insulating layer; patterning the second metal layer to form a gate, wherein the gate and the active layer are opposite to each other; using the patterned gate as a mask plate to pattern the gate insulating layer to expose the active layer disposed on the first electrode; and using the patterned gate as the mask plate to metalize the exposed active layer to form a second electrode and a first electrode contact part which are connected to the active layer, wherein the first electrode contact part is connected to the first electrode by the first via.

Regarding the beneficial effects: in the present disclosure, a first electrode and a gate of a TFT are disposed on two sides of the active layer. By individually disposing a gate insulating layer between the gate and the active layer and an interlayer insulating layer between the first electrode and the active layer, a thickness of the gate insulating layer between the gate and the active layer and a thickness of the interlayer insulating layer between the first electrode and the active layer can be individually adjusted. Therefore, the thickness of the gate insulating layer can be reduced to reduce Vgs and the thickness of the interlayer insulating layer can be increased to improve a pressure resistance between the gate and the drain (first electrode). Moreover, increasing the thickness of the interlayer insulating layer can also reduce capacitance between the gate and the drain (first electrode), thereby significantly improving comprehensive electrical performance of the TFT.

In addition, in a manufacturing method of a display panel provided by the present disclosure, patterning of a gate insulating layer and metalization of an active layer are completed by a gate self-alignment process of a gate. Therefore, two mask plates can be saved, thereby reducing manufacturing cost.

DESCRIPTION OF DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which those skilled in the art can derive further figures without making any inventive efforts.

DETAILED DESCRIPTION

Hereinafter preferred embodiments of the present disclosure will be described with reference to the accompanying drawings to exemplify the embodiments of the present disclosure can be implemented, which can fully describe the technical contents of the present disclosure to make the technical content of the present disclosure clearer and easy to understand. However, the described embodiments are only some of the embodiments of the present disclosure, but not all of the embodiments. All other embodiments obtained by those skilled in the art based on the embodiments of the present disclosure without creative efforts are within the scope of the present disclosure.

The present disclosure provides a TFT, including a gate, a gate insulating layer, an active layer, an auxiliary electrode, an interlayer insulating layer, a first electrode, and a second electrode. The gate insulating layer is disposed on a side of the gate. The active layer is disposed on a side of the gate insulating layer away from the gate. The active layer is disposed opposite to the gate. The auxiliary electrode is disposed opposite to the active layer. The interlayer insulating layer is disposed between the auxiliary electrode and the active layer to insulate the auxiliary electrode from the active layer. A thickness of the interlayer insulating layer is greater than a thickness of the gate insulating layer. The first electrode and the auxiliary electrode are disposed on a same layer. A first via penetrating the interlayer insulating layer and extending to a surface of the first electrode is defined on the interlayer insulating layer. The active layer is connected to the first electrode by the first via. The second electrode is connected to the active layer. The second electrode and the active layer are disposed on a same layer.

Figure 1:
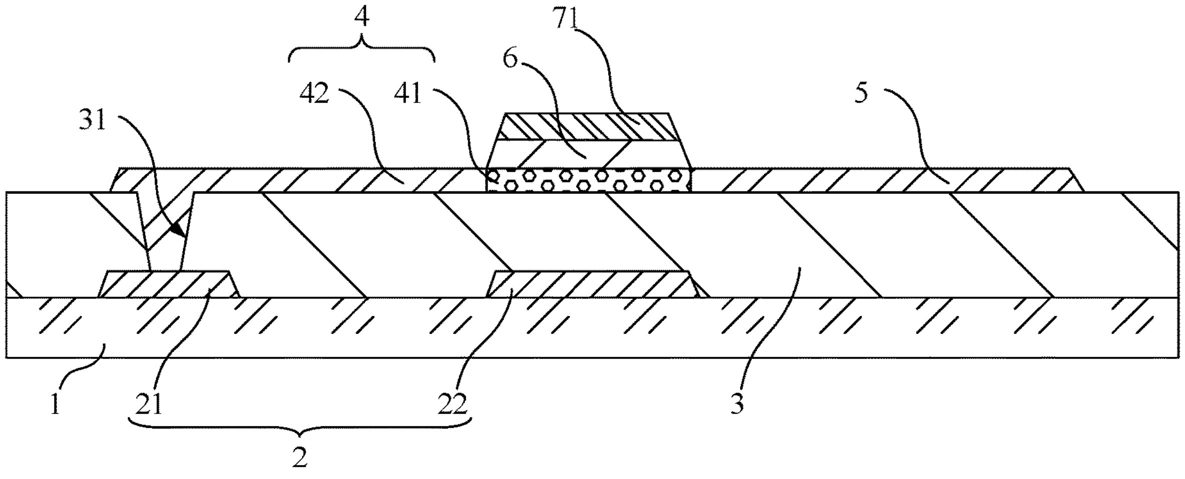
FIG. 1 is a cross-sectional schematic view showing a TFT according to a specific embodiment of the present disclosure.

Specifically, as shown in FIG. 1, The TFT is disposed on a substrate 1.

The substrate 1 is an array substrate. The substrate 1 is a rigid substrate which can be made of glass. It should be understood that the substrate 1 may also be a flexible substrate which can be made of an organic insulating material, such as polyimide (PI) and polyethylene terephthalate (PET), that can block moisture and oxygen. No specific limitation is given here.

A first metal layer 2 is disposed on the substrate 1. The first metal layer 2 is patterned to form a first electrode 21 and an auxiliary electrode 22 of the TFT. The first metal layer 2 can be made of one or more of a common conductive metal, such as Mo, Al, Ti, and Cu, and an alloy. The first metal layer 2 may have a single-layer conductive layer structure made of single metal or may have a multi-layer conductive layer structure made of multiple metal. No specific limitation is given here. The first electrode 21 may be a source or a drain. In the present embodiment, the first electrode 21 is the drain connected to a data line.

The interlayer insulating layer 3 is disposed on the first metal layer 2. The interlayer insulating layer 3 covers the first electrode 21 and the auxiliary electrode 22. A first via 31 penetrating the interlayer insulating layer 3 and extending to a surface of the first electrode 21 is defined on the interlayer insulating layer 3. Commonly, the interlayer insulating layer 3 is formed by depositing or sputtering one or more of a common inorganic material, such as SiNx, SiOx, and $Al_2O_3$, that can block moisture and oxygen. The interlayer insulating layer 3 may also be made of an organic insulating layer to have a flat surface.

The active layer 4 is disposed on the interlayer insulating layer 3. The active layer 4 may be made of a common semiconductor material such as a metal oxide, amorphous silicon, or polycrystalline silicon. A middle area of the active layer 4 corresponds to the auxiliary electrode 22. The active layer 4 includes a semiconductor part 41 and a first electrode contact part 42. Conductivity of the first electrode contact part 42 is less than conductivity of the first electrode 21. The conductivity of the first electrode contact part 42 is greater than conductivity of the semiconductor part 41. The first electrode contact part 42 is connected to the first electrode 21 by the first via 31.

The second electrode 5 is connected to the active layer 4. The second electrode 5 is connected to the semiconductor part 41. The second electrode 5 may be the drain or the source. In the present embodiment, the second electrode 5 is the source connected to a pixel electrode or other circuits. The second electrode 5 and the active layer 4 are disposed on a same layer. The second electrode 5 and the first electrode contact part 42 are respectively disposed on two sides of the semiconductor part 41.

The gate insulating layer 6 is disposed on the active layer 4. The gate insulating layer 6 covers the semiconductor part 41. Commonly, the gate insulating layer 6 is formed by depositing or sputtering one or more of a common inorganic material such as SiNx, SiOx, and $Al_2O_3$. Generally, an insulating layer having a single layer can satisfy yield rate requirements of display panels. However, in display panels having an active layer made of polysilicon or a metal oxide, an insulating layer having a structure of multiple layers which are stacked may also be applied to improve a yield rate, thereby ensuring that moisture and oxygen can be effectively blocked. In the present embodiment, the gate insulating layer 6 has a structure having a single layer of SiO2 or a single layer of SiNx.

The gate 71 is disposed on the gate insulating layer 6. The gate 71 is disposed opposite to the semiconductor part 41. The gate 71 can be made of one or more of a common conductive metal, such as Mo, Al, Ti, and Cu, and an alloy. The gate 71 may have a single-layer conducive layer structure having a single metal or may have a multi-layer conductive layer structure having multiple metals. A specific limitation is not given here.

The auxiliary electrode 22 may be an auxiliary gate and/or a light-shielding electrode. The auxiliary electrode 22 is disposed opposite to the semiconductor part 41. When the auxiliary electrode 22 is the auxiliary gate, the auxiliary electrode 22 may be made of a conductive material such as metal or indium tin oxide (ITO). By disposing the auxiliary electrode 22 opposite to the semiconductor part 41, electrical performance of the TFT can be effectively improved. The auxiliary electrode 22 can be the light-shielding electrode when it is made of metal or other non-transparent materials. By disposing the auxiliary electrode 22 opposite to the semiconductor part 41, light can be prevented from being emitted on the semiconductor part 41, which affects electrical performance of the TFT.

In the TFT provided by the present embodiment, the first electrode 21 and the gate 71 are disposed on two sides of the active layer 4. The first electrode 21 is insulated from the active layer 4 by the interlayer insulating layer 3. The gate 71 is insulated from the active layer 4 by the gate insulating layer 6. An insulating layer between the gate 71 and the active layer 4 is independent from an insulating layer between the source/drain and the active layer 4. Therefore, a thickness of the insulating layer between the gate 71 and the active layer 4 and a thickness of the insulating layer between the source/drain and the active layer 4 can be individually adjusted. As such, an issue of conventional technologies can be solved: when a gate and a source/drain are disposed on a same side of an active layer, reducing a thickness of a gate insulating layer to reduce Vgs will simultaneously reduce other electrical performance of TFTs.

A thickness of the interlayer insulating layer 3 is greater than a thickness of the gate insulating layer 6. The thickness of the gate insulating layer 6 is reduced according to a predetermined target value of Vgs of the TFT. Meanwhile, the thickness of the interlayer insulating layer 3 can be unchanged or increased. Therefore, a pressure resistance between the gate 71 and the drain (first electrode 21) will not be affected when the thickness of the gate insulating layer 6 is reduced, and capacitance between the gate 71 and the drain (first electrode 21) can be increased by appropriately increasing the thickness of the interlayer insulating layer 3. Because of the above design, every electrical performance of the TFT can be significantly improved.

Optionally, the thickness of the interlayer insulating layer 3 is greater than or equal to two times the thickness of the gate insulating layer 6. When the thickness of the gate insulating layer 6 is one-third of the thickness of the interlayer insulating layer 3, comprehensive electrical performance of the TFT is improved.

Optionally, a lateral edge of the gate 71, a lateral edge of the gate insulating layer 6, and a lateral edge of the semiconductor part 41 of the active layer 4 are aligned with each other, thereby reducing a number of mask plates for manufacturing the TFT. Specifically, the active layer 4 includes a metal oxide semiconductor such as indium gallium zinc oxide (IGZO) or indium gallium zinc tin oxide (IGZTO). The gate insulating layer 6 is patterned with the patterned gate 71 as a plate mask to expose the active layer 4 disposed on the first electrode 21. The exposed active layer 4 is metalized with the patterned gate 71 as a plate mask to form the second electrode 5 and the first electrode contact part 42 which are connected to the active layer 4. The first electrode contact part 42 is connected to the first electrode 21 by the first via 31. Patterning of the gate insulating layer 6 and metalization of the active layer 4 are completed by a self-alignment process of the gate 71. Therefore, two mask plates are saved, thereby reducing manufacturing cost.

Figure 2:
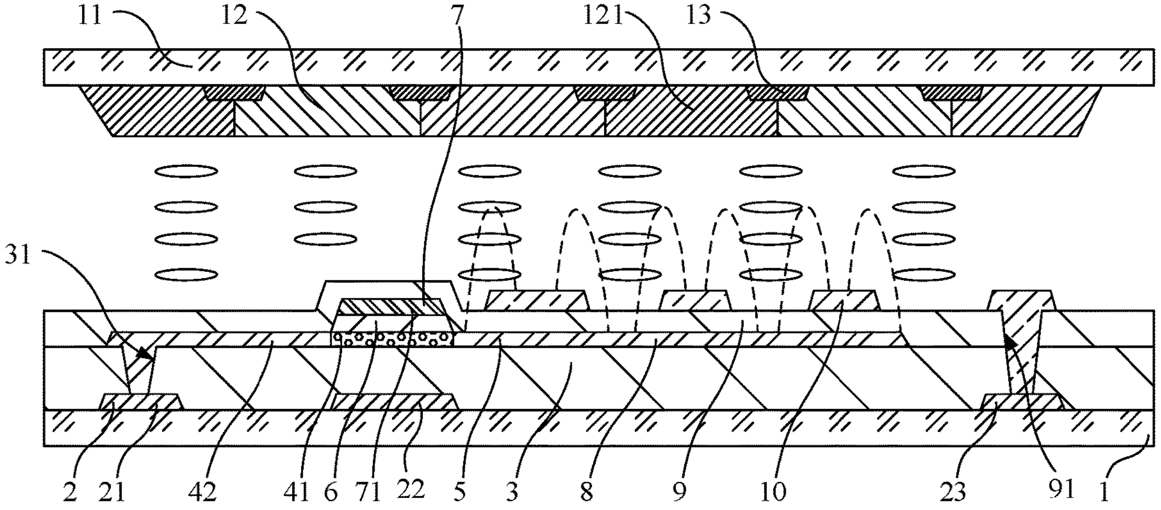
FIG. 2 is a cross-sectional schematic view showing a display area of a display panel according to a first embodiment of the present disclosure.

As shown in FIG. 2, the present disclosure further provides a first embodiment of a display panel. The display panel includes a substrate 1, and a first metal layer 2, an interlayer insulating layer 3, an active layer 4, a second electrode 5, a gate insulating layer 6, a second metal layer 7, a pixel electrode 8, a passivation layer 9, and a common electrode layer 10 which are disposed on the substrate 1.

The substrate 1 is an array substrate. The substrate 1 is a rigid substrate which can be made of glass. It should be understood that the substrate 1 may also be a flexible substrate which can be made of an organic insulating material, such as PI and PET, that can block moisture. No specific limitation is given here.

A first metal layer 2 is disposed on the substrate 1. The first metal layer 2 is patterned to form a data line (not shown), and a first electrode 21, an auxiliary electrode 22, and a common electrode line 23 of the TFT. The first metal layer 2 can be made of one or more of a common conductive metal, such as Mo, Al, Ti, and Cu, and an alloy. The first metal layer 2 may have a single-layer conductive layer structure made of a single metal or may have a multi-layer conductive layer structure made of multiple metals. No specific limitation is given here. The first electrode 21 may be a source or a drain. In the present embodiment, the first electrode 21 is the drain connected to a data line.

The auxiliary electrode 22 may be an auxiliary gate and/or a light-shielding electrode. The auxiliary electrode 22 is disposed opposite to the semiconductor part 41. When the auxiliary electrode 22 is the auxiliary gate, the auxiliary electrode 22 may be made of a conductive material such as metal or ITO. By disposing the auxiliary electrode 22 opposite to the semiconductor part 41, electrical performance of the TFT can be effectively improved. The auxiliary electrode 22 can be the light-shielding electrode when it is made of metal or other non-transparent materials. By disposing the auxiliary electrode 22 opposite to the semiconductor part 41, light can be prevented from being emitted on the semiconductor part 41, and electrical performance of the TFT can be prevented from being affected.

The interlayer insulating layer 3 is disposed on the first metal layer 2. The interlayer insulating layer 3 covers the data line, the first electrode 21, the auxiliary electrode 22, and the common electrode line 23. A first via 31 penetrating the interlayer insulating layer 3 and extending to a surface of the first electrode 21 is defined on the interlayer insulating layer 3. Commonly, the interlayer insulating layer 3 is formed by depositing or sputtering one or more of a common inorganic material, such as SiNx, SiOx, and $Al_2O_3$, that can block moisture and oxygen. Generally, an insulating layer having a single layer can satisfy yield rate requirements of display panels. However, in display panels having an active layer made of polysilicon or a metal oxide, an insulating layer having a structure of multiple layers which are stacked may also be applied to improve a yield rate, thereby ensuring that moisture and oxygen can be effectively blocked. In the present embodiment, the insulating layer 3 has a structure having a single layer of SiO2 or a single layer of SiNx.

The active layer 4 is disposed on the interlayer insulating layer 3. The active layer 4 may be made of a common semiconductor material such as a metal oxide, an amorphous silicon, or a polycrystalline silicon. In the present embodiment, the active layer 4 is made of a metal oxide semiconductor. A middle area of the active layer 4 corresponds to the auxiliary electrode 22. The active layer 4 includes a semiconductor part 41 and a first electrode contact part 42. Conductivity of the first electrode contact part 42 is less than conductivity of the first electrode 21. The conductivity of the first electrode contact part 42 is greater than conductivity of the semiconductor part 41. The first electrode contact part 42 is connected to the first electrode 21 by the first via 31.

The second electrode 5 is connected to the active layer 4. The second electrode 5 is connected to the semiconductor part 41. The second electrode 5 may be the drain or the source. The second electrode 5 and the active layer 4 are disposed on a same layer. The second electrode 5 and the first electrode contact part 42 are respectively disposed on two sides of the semiconductor part 41.

The gate insulating layer 6 is disposed on the active layer 4. The gate insulating layer 6 covers the semiconductor part 41. Commonly, the gate insulating layer 6 is formed by depositing or sputtering one or more of a common inorganic material such as SiNx, SiOx, and $Al_2O_3$. Generally, an insulating layer having a single layer can satisfy yield rate requirements of display panels. However, in display panels having an active layer made of polysilicon or a metal oxide, an insulating layer having a structure of multiple layers which are stacked may also be applied to improve a yield rate, thereby ensuring that moisture and oxygen can be effectively blocked. In the present embodiment, the gate insulating layer 6 has a structure having a single layer of SiO2 or a single layer of SiNx.

The second metal layer 7 is disposed on the gate insulating layer 6. The second metal layer 7 is patterned to form a gate 71 and a scan line (not shown) of the TFT. The gate 71 is disposed opposite to the semiconductor part 41. The second metal layer 7 may be made of one or more of common conductive metal, such as Mo, Al, Ti, and Cu, and an alloy. The second metal layer 7 may have a single-layer conductive layer structure having a single metal or may be a multi-layer conductive metal structure having multiple metals. A specific limitation is not given here.

The pixel electrode 8 is disposed on the interlayer insulating layer 3. The pixel electrode 8, the active layer 4, and the second electrode 5 are disposed on a same layer. The pixel electrode 8 and the second electrode 5 are formed by performing a metal-doping process on the active layer 4. The pixel electrode 8 and the second electrode 5 are integrated. An end of the second electrode 5 is connected to the semiconductor part 41, and another end of the second electrode 5 is connected to the pixel electrode 8. The pixel electrode 8 and the second electrode 5 are formed by performing the metal-doping process on an oxide semiconductor layer. In some embodiments, the second electrode 5 can be omitted or can be regarded as a part of the pixel electrode 8, which can be determined according to the pattern of the pixel electrode 8.

The passivation layer 9 is disposed on the second metal layer 7. The passivation layer 9 covers the gate 71, the scan line, the first electrode contact part 42, the second electrode 5, and the pixel electrode 8. A second via 91 penetrating the passivation layer 9 and the interlayer insulating layer 3 and extending to a surface of a common electrode line 23 is defined on the passivation layer 9. Commonly, the passivation layer 9 is formed by depositing or sputtering one or more of a common inorganic material such as SiNx, SiOx, and $Al_2O_3$. Generally, an insulating layer having a single layer can satisfy yield rate requirements of display panels. However, in display panels having an active layer made of polysilicon or a metal oxide, an insulating layer having a structure of multiple layers which are stacked may also be applied to improve a yield rate, thereby ensuring that moisture and oxygen can be effectively blocked.

The common electrode 10 is disposed on the passivation layer 9. The common electrode 10 can be made of a transparent ITO material. The common electrode 10 is connected to the common electrode line 23 by the second via 91. In the present embodiment, the display panel is a fringe field switching (FFS) display panel. By stacking the planarly-disposed pixel electrode 8 and the patterned common electrode 10, a horizontal edge electrical field can be generated, thereby driving liquid crystals to be oriented. To ensure display quality, the interlayer insulating layer 3 below the pixel electrode 8 needs to be an organic insulating planarization layer. Therefore, the pixel electrode 8 can be ensured to be disposed on a same horizontal surface as possible. The common electrode 10 is disposed opposite to the pixel electrode 8, thereby generating a horizontal electrical afield to drive the liquid crystals. It should be understood that the common electrode 10 may have a star-shaped pattern, a comb-shaped pattern, or other patterns. A specific limitation is not given here.

A first alignment (not shown) is disposed on the common electrode 10 to adjust an orientation angle of the liquid crystals.

The display panel further includes a base plate 11, and a color filter layer 12, a light-shielding layer 13, and a second alignment layer (not shown) which are disposed on the substrate 11.

The base plate 11 is disposed opposite to the substrate 1. A material of the base plate 11 and a material of the substrate 1 are same an are not described here.

The color filter layer 12 includes a plurality of optical filters 121. Each sub-pixel area is provided with one optical filter 121. The optical filters 121 are disposed opposite to the pixel electrode 8.

The light-shielding layer 13 is disposed between two adjacent optical filters 121 to prevent a mixture of colors. Generally, the light-shielding layer 13 is made of a black resin material.

The second alignment layer covers the color filter layer 12 and the light-shielding layer 13 to adjust the orientation angle of the liquid crystals.

The display panel further includes a liquid crystal layer (not shown) and a barrier component (not shown) disposed between the substrate 1 and the base plate 11.

A display area of the display panel is provided with a plurality of scan lines extending along a first direction and a plurality of data lines extending along a second direction. The scan lines cross the data lines to define a plurality of sub-pixel areas arranged in an array manner. The TFT composed of the gate 71, the second electrode 5, the first electrode 21, and the active layer 4 and the pixel electrode 8 connected to the TFT are disposed in the sub-pixel units.

The auxiliary electrode 22 is disposed opposite to the semiconductor part 41. When the auxiliary electrode 22 is the auxiliary gate, the auxiliary electrode 22 may be made of a conductive material such as metal or ITO. By disposing the auxiliary electrode 22 opposite to the semiconductor part 41, electrical performance of the TFT can be effectively improved. The auxiliary electrode 22 can be the light-shielding electrode when it is made of metal or other non-transparent materials. By disposing the auxiliary electrode 22 opposite to the semiconductor part 41, light can be prevented from being emitted on the semiconductor part 41, and electrical performance of the TFT can be prevented from being affected.

In the display panel provided by the present embodiment, the first electrode 21 and the gate 71 of the TFT are disposed on two sides of the active layer 4. The first electrode 21 is insulated from the active layer 4 by the interlayer insulating layer 3. The gate 71 is insulated from the active layer 4 by the gate insulating layer 6. An insulating layer between the gate 71 and the active layer 4 is independent from an insulating layer between the source/drain and the active layer 4. Therefore, a thickness of the insulating layer between the gate 71 and the active layer 4 and a thickness of the insulating layer between the source/drain and the active layer 4 can be individually adjusted. As such, an issue of conventional technologies can be solved: when a gate and a source/drain are disposed on a same side of an active layer, reducing a thickness of a gate insulating layer to reduce Vgs will simultaneously reduce other electrical performance of TFTs.

A thickness of the interlayer insulating layer 3 is greater than a thickness of the gate insulating layer 6. The thickness of the gate insulating layer 6 is reduced according to a predetermined target value of Vgs of the TFT. Meanwhile, the thickness of the interlayer insulating layer 3 can be unchanged or increased. Therefore, a pressure resistance between the gate 71 and the drain (first electrode 21) will not be affected when the thickness of the gate insulating layer 6 is reduced, and capacitance between the gate 71 and the drain (first electrode 21) can be increased by appropriately increasing the thickness of the interlayer insulating layer 3. Because of the above design, every electrical performance of the TFT can be significantly improved.

Optionally, the thickness of the interlayer insulating layer 3 is greater than or equal to two times the thickness of the gate insulating layer 6. When the thickness of the gate insulating layer 6 is one-third of the thickness of the interlayer insulating layer 3, comprehensive electrical performance of the TFT is improved.

Optionally, a lateral edge of the gate 71, a lateral edge of the gate insulating layer 6, and a lateral edge of the semiconductor part 41 of the active layer 4 are aligned with each other, thereby reducing a number of mask plates for manufacturing the TFT. Specifically, the active layer 4 includes a metal oxide semiconductor such as IGZO or IGZTO. The gate insulating layer 6 is patterned with the patterned gate 71 as a plate mask to expose the active layer 4 disposed on the first electrode 21. The exposed active layer 4 is metalized with the patterned gate 71 as a plate mask to form the second electrode 5 and the first electrode contact part 42 which are connected to the active layer 4. The first electrode contact part 42 is connected to the first electrode 21 by the first via 31. Patterning of the gate insulating layer 6 and metalization of the active layer 4 are completed by a self-alignment process of the gate 71. Therefore, two mask plates are saved, thereby reducing manufacturing cost.

Figure 3:
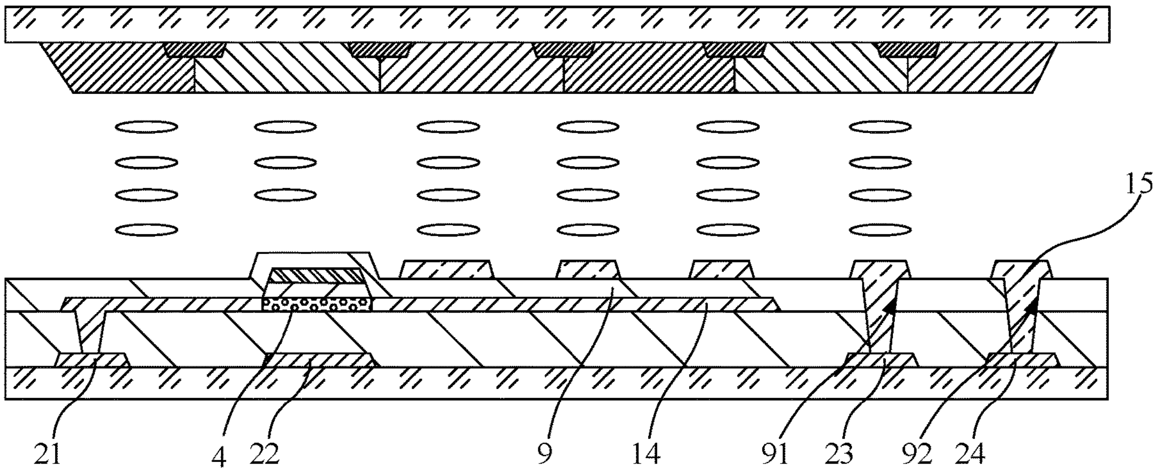
FIG. 3 is a cross-sectional schematic view showing a display area of a display panel according to a second embodiment of the present disclosure.

As shown in FIG. 3, the present embodiment further provides a second embodiment of a display panel. Differences between the present embodiment and the first embodiment include:

The first metal layer 2 further includes a touch control signal line. The first metal layer 2 is patterned to form the first electrode 21, the auxiliary electrode 22, the common electrode line 23, and a touch control signal line 24.

A third via 92, which penetrates the passivation layer 9 and the interlayer insulating layer 3, extends to the second via 91 on the surface of the common electrode line 23, and extends to a surface of the touch control signal line 24, is defined on the passivation layer 9.

When the display panel has a mutual-capacitive touch control structure, the display panel further includes a first touch control electrode 14 and a second touch control electrode 15. The first touch control electrode 14 and the active layer 4 are disposed on a same layer. The touch control electrode 14 is connected to the active layer 4. The second touch control electrode 15 is insulated from the first touch control electrode 14 and is disposed opposite to the first touch control electrode 14. The second touch control electrode 15 and the common electrode 10 are disposed on a same layer. The second touch control electrode 15 is connected to the touch control signal line 24 by the third via 92.

When the display panel has a self-capacitive touch control structure, the display panel only includes a layer of the second touch control electrode 15 disposed on a same layer as the common electrode. The second touch control electrode 15 is connected to the touch control signal line 24 by the third via 92.

Other structures of the present embodiment are same as the structures of the first embodiment and are not described again here.

As shown in FIGS. 4A to 4G, the present disclosure further provides a specific embodiment of a method of manufacturing a display panel, including following steps:

B1, providing a substrate 1.

Figure 4A:
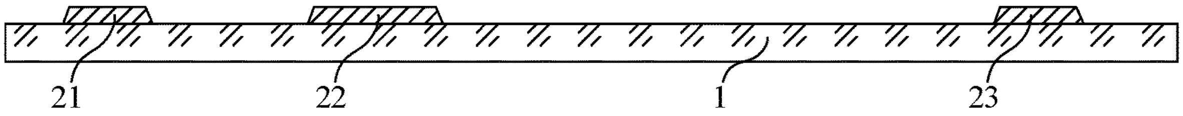
FIGS. 4A to 4G are structural schematic views showing manufacturing processes of the display panel in FIG. 2.

B2, as shown in FIG. 4A, forming a first metal layer 2 on the substrate 1, and patterning the first metal layer 2 to form a first electrode 21.

Optionally, the step B2 includes forming the first metal layer 2 on the substrate 1, and patterning the first metal layer 2 to form the first electrode 21, an auxiliary electrode layer 2, a common electrode line 23, and a data line (not shown).

Figure 4B:
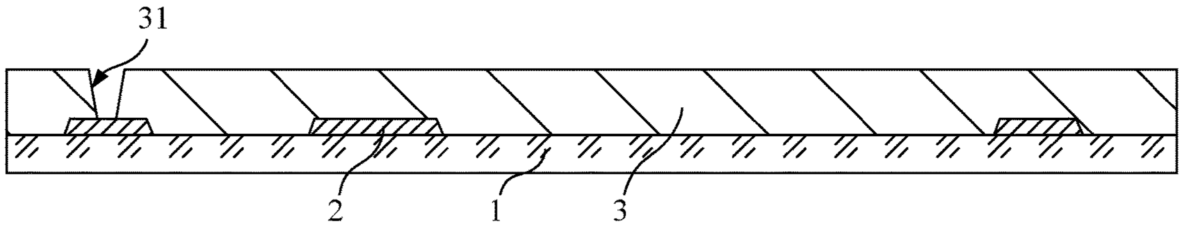

B3, as shown in FIG. 4B, disposing an interlayer insulating layer 3 on the first metal layer 2, and patterning the interlayer insulating layer 3 to form a first via 31. The first via 31 penetrates the interlayer insulating layer 3 and extends to a surface of the first electrode 21.

Figure 4C:
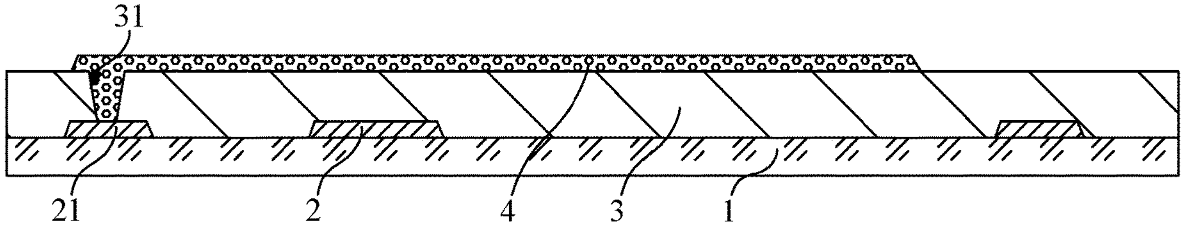

B4, as shown in FIG. 4C, disposing a patterned active layer 4 on the interlayer insulating layer 3. The active layer 4 is connected to the first electrode 21 by the first via 31. The active layer 4 is an oxide semiconductor layer.

Figure 4D:
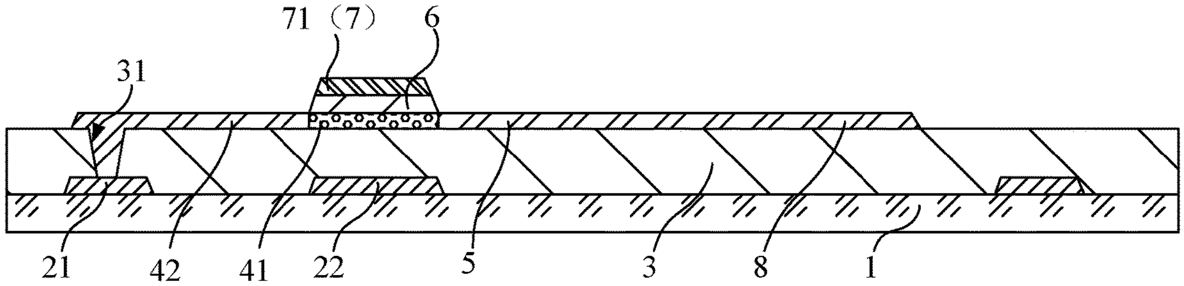

B5, as shown in FIG. 4D, forming a gate insulating layer 6 and a second metal layer 7 on the active layer 4, wherein a thickness of the interlayer insulating layer 3 is greater than or equal to two times a thickness of the gate insulating layer 6, and patterning the second metal layer 7 to form a gate 71 and a scan line (not shown), wherein the gate 71 is disposed opposite to the active layer 4. Optionally, the gate 71 is disposed opposite to the auxiliary electrode 22.

Patterning the gate insulating layer 6 with the patterned gate 71 as a mask plate to expose the active layer 4 disposed on the first electrode 21, aligning a lateral edge of the gate 71 with a lateral edge of the gate insulating layer 6. Using the gate 71 as a mask plate to pattern the gate insulating layer 6 can save one mask plate.

Performing a metal-doping process on the exposed active layer 4 with the patterned gate 71 as a mask plate to form a pixel electrode 8, and a second electrode 5 and the first electrode contact part 42 which are connected to a semiconductor part 41, and aligning the lateral edge of the gate 71, the lateral edge of the gate insulating layer 6, and a lateral edge of the semiconductor part 41 with each other. The first electrode contact part 42 is connected to the first electrode 21 by the first via 31.

The second electrode 5 is connected to the active layer 4. The second electrode 5 is connected to the semiconductor part 41. The second electrode 5 is a drain or a source. The second electrode 5 and the semiconductor part 41 are disposed on a same layer. The second electrode 5 and the first electrode contact part 42 are respectively disposed on two sides of the semiconductor part 41.

The second electrode 5 and the pixel electrode 8 have a same material. A pattern of the pixel electrode 8 is planar. The second electrode 5 and the pixel electrode 8 are integrated. The pixel electrode 8 and the second electrode 5 are formed by performing a metal-doping process on an oxide semiconductor layer. In some embodiments, the second electrode 5 can be omitted or can be regarded as a part of the pixel electrode 8, which can be determined according to the pattern of the pixel electrode 8.

Figure 4E:
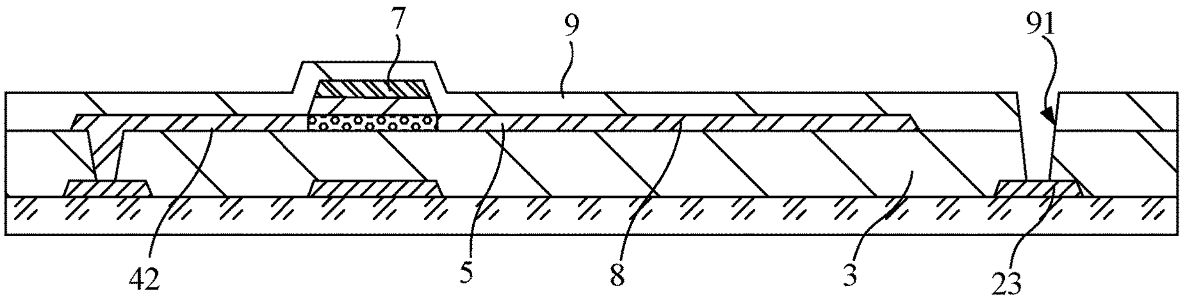

B6, as shown in FIG. 4E, forming a passivation layer 9 on the second metal layer 7, wherein the passivation layer 9 covers the gate 71, the scan line, the first electrode contact part 42, the second electrode 5, and the pixel electrode 8, and patterning the passivation layer 9 to define a second via 91 penetrating the passivation layer 9 and the interlayer insulating layer 3 and extending to a surface of a common electrode line 23.

Figure 4F:
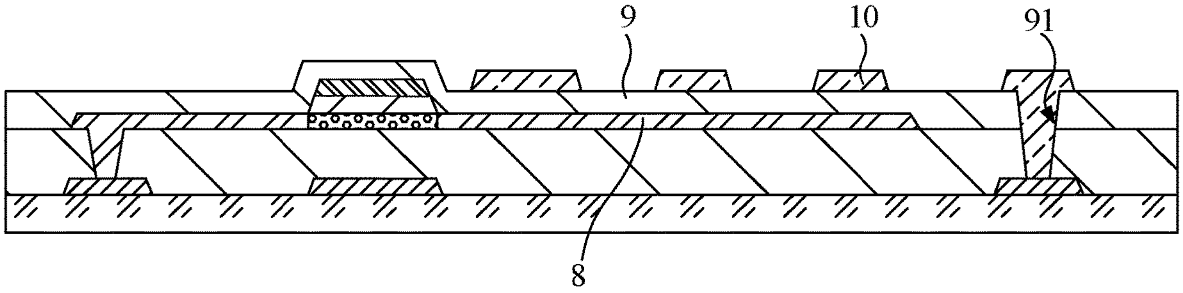

B7, as shown in FIG. 4F, forming a common electrode layer on the passivation layer 9, and patterning the common electrode layer to form a common electrode 10. The common electrode 10 can be made of a transparent ITO material. The common electrode 10 is comb-shaped. By stacking the planarly-disposed pixel electrode 8 and the patterned common electrode 10, a horizontal edge electrical field can be generated, thereby driving liquid crystals to be oriented. The common electrode 10 is connected to the common electrode line 23 by the second via 91.

Figure 4G:
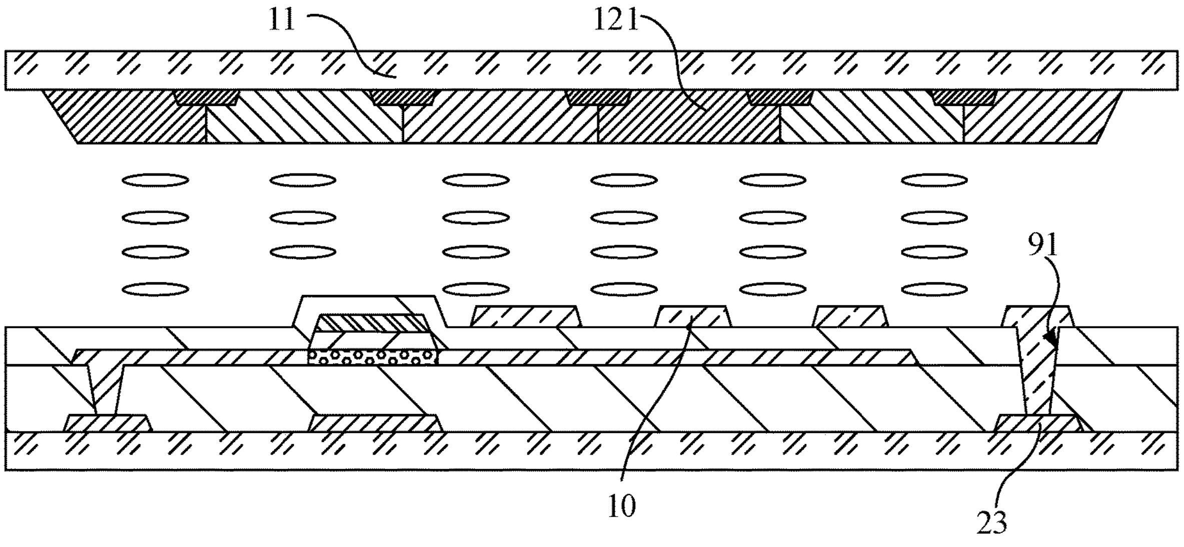

B8, as shown in FIG. 4G, covering a color filter substrate on the common electrode 10, and sealing the liquid crystals between the color filter substrate and an optical filter 121.

In the display panel provided by the present embodiment, the first electrode 21 and the gate 71 of the TFT are disposed on two sides of the active layer 4. The gate insulating layer 6 between the gate 71 and the active layer 4 is independent from the interlayer insulating layer 6 between the first electrode 21 and the active layer 4. Therefore, a thickness of the gate insulating layer 6 between the gate 71 and the active layer 4 and a thickness of the interlayer insulating layer 6 between the first electrode 21 and the active layer 4 can be individually adjusted. Therefore, the thickness of the gate insulating layer 6 can be reduced to reduce Vgs and the thickness of the interlayer insulating layer 3 can be increased to improve a pressure resistance between the gate 7 and the drain (first electrode 21). Moreover, increasing the thickness of the interlayer insulating layer 3 can also reduce capacitance between the gate 7 and the drain (first electrode 21), thereby significantly improving comprehensive electrical performance of the TFT.

In addition, in a manufacturing method of a display panel provided by the present disclosure, patterning of the gate insulating layer 6 and metalization of an active layer 4 are completed by a gate self-alignment process of the gate 71. Therefore, two mask plates can be saved, thereby reducing manufacturing cost.

A TFT, a display panel, and a manufacturing method of the display panel have been described in detail by the above embodiments, which illustrate principles and implementations thereof. However, the description of the above embodiments is only for helping to understand the technical solution of the present disclosure and core ideas thereof, and it is understood by those skilled in the art that many changes and modifications to the described embodiments can be carried out without departing from the scope and the spirit of the disclosure that is intended to be limited only by the appended claims.

What is claimed is:

1. A thin-film transistor (TFT), comprising:

a gate;

a gate insulating layer disposed on a side of the gate;

an active layer disposed on a side of the gate insulating layer away from the gate and disposed opposite to the gate;

a first electrode disposed on a side of the active layer away from the gate; and an interlayer insulating layer disposed between the first electrode and the active layer to insulate the first electrode from the active layer, a first via penetrating the interlayer insulating layer and extending to a surface of the first electrode is defined on the interlayer insulating layer, the active layer is connected to the first electrode by the first via, and a thickness of the interlayer insulating layer is greater than a thickness of the gate insulating layer; and a second electrode connected to the active layer, wherein the second electrode and the active layer are disposed on a same layer;

wherein the active layer comprises a semiconductor part in electrical contact with the second electrode, and a first electrode contact part in electrical contact with the semiconductor part;

wherein the semiconductor part of the active layer comprises one of a source region and a drain region, the first electrode contact part serves as another of the source region and the drain region, and a channel is sandwiched between the source region and the drain region, wherein a lateral edge of the gate, a lateral edge of the gate insulating layer, and a lateral edge of the source region or the drain region in the semiconductor part facing away from the channel of the semiconductor part are aligned with each other.

2. The TFT of claim 1, comprising:

an auxiliary electrode disposed opposite to the active layer, wherein the interlayer insulating layer is disposed between the auxiliary electrode and the active layer.

3. The TFT of claim 2, wherein the first electrode and the auxiliary electrode are disposed on a same layer, and the active layer is connected to the first electrode by the first via.

4. The TFT of claim 1, wherein conductivity of the first electrode contact part is less than conductivity of the first electrode, and the conductivity of the first electrode contact part is greater than conductivity of the semiconductor part; and the first electrode contact part is connected to the first electrode by the first via.

5. The TFT of claim 1, wherein the first electrode is a drain electrode, and the second electrode is a source electrode;

the lateral edge of the gate, the lateral edge of the gate insulating layer, and the lateral edge of the source region in the semiconductor part are aligned with each other; and the thickness of the interlayer insulating layer is greater than or equal to two times the thickness of the gate insulating layer.

6. The TFT of claim 5, wherein the thickness of the interlayer insulating layer is equal to three times the thickness of the gate insulating layer.

7. A display panel, comprising:

a first electrode disposed on a first metal layer;

an interlayer insulating layer disposed on the first electrode, wherein a first via penetrating the interlayer insulating layer and extending to a surface of the first electrode is defined on the interlayer insulating layer;

an active layer disposed on the interlayer insulating layer, wherein the active layer is connected to the first electrode by the first via;

a second electrode connected to the active layer;

a gate insulating layer disposed on the active layer; and a gate disposed on a second metal layer disposed on the gate insulating layer, wherein the gate is disposed opposite to the active layer;

wherein a thickness of the interlayer insulating layer is greater than a thickness of the gate insulating layer;

wherein the active layer comprises a semiconductor part in electrical contact with the second electrode, and a first electrode contact part in electrical contact with the semiconductor part;

wherein the semiconductor part of the active layer comprises one of a source region and a drain region, the first electrode contact part serves as another of the source region and the drain region, and a channel is sandwiched between the source region and the drain region, wherein a lateral edge of the gate, a lateral edge of the gate insulating layer, and a lateral edge of the source region or the drain region in the semiconductor part facing away from the channel of the semiconductor part are aligned with each other.

8. The display panel of claim 7, comprising:

an auxiliary electrode disposed opposite to the active layer, wherein the interlayer insulating layer is disposed between the auxiliary electrode and the active layer.

9. The display panel of claim 7, wherein the first electrode is a drain and the second electrode is a source; or the first electrode is the source and the second electrode is the drain.

10. The display panel of claim 8, wherein the auxiliary electrode is disposed on the first metal layer, and the interlayer insulating layer covers the first electrode and the auxiliary electrode.

11. The display panel of claim 7, wherein conductivity of the first electrode contact part is less than conductivity of the first electrode, and the conductivity of the first electrode contact part is greater than conductivity of the semiconductor part; and the first electrode contact part is connected to the first electrode by the first via.

12. The display panel of claim 7, comprising a pixel electrode, wherein the pixel electrode and the active layer are disposed on a same layer, the pixel electrode is electrically connected to the active layer, and the active layer comprises a metal oxide semiconductor.

13. The display panel of claim 12, comprising:

a substrate, wherein the first metal layer is disposed on the substrate and comprises a plurality of data lines;

a plurality of scan lines disposed on the second metal layer, wherein the scan lines cross the data lines to define a plurality of sub-pixel units, and a thin-film transistor (TFT) composed of the first electrode, the second electrode, the gate, and the active layer and the pixel electrode connected to the TFT are disposed in the sub-pixel units;

a passivation layer disposed on the second metal layer and covering the gate and the pixel electrode; and a common electrode disposed on the passivation layer and disposed opposite to the pixel electrode.

14. The display panel of claim 7, wherein the first electrode is a drain electrode, and the second electrode is a source electrode;

the lateral edge of the gate, the lateral edge of the gate insulating layer, and the lateral edge of the source region in the semiconductor part are aligned with each other; and the thickness of the interlayer insulating layer is greater than or equal to two times the thickness of the gate insulating layer.

15. The display panel of claim 14, wherein the thickness of the interlayer insulating layer is equal to three times the thickness of the gate insulating layer.

16. The display panel of claim 7, wherein the first metal layer comprises a touch control signal line; and the display panel comprises:

a first touch control electrode, wherein the first touch control electrode and the active layer are disposed on a same layer, and the first touch control electrode is connected to the active layer.

17. The display panel of claim 7, comprising a second touch control electrode, wherein the second touch control electrode is insulated from the first touch control electrode and is disposed opposite to the first touch control electrode.

18. A method of manufacturing the display panel, comprising following steps:

providing a substrate;

forming a first metal layer on the substrate, and patterning the first metal layer to form a first electrode;

disposing an interlayer insulating layer on the first metal layer, and patterning the interlayer insulating layer to form a first via;

disposing a patterned active layer on the interlayer insulating layer, wherein the active layer is connected to the first electrode by the first via, and the active layer comprises a metal oxide semiconductor;

forming a gate insulating layer and a second metal layer on the active layer, and a thickness of the interlayer insulating layer is greater than or equal to two times a thickness of the gate insulating layer;

patterning the second metal layer to form a gate, wherein the gate and the active layer are disposed opposite to each other;

using a patterned gate as a mask plate to pattern the gate insulating layer to expose the active layer disposed on the first electrode; and using the patterned gate as the mask plate to metalize an exposed active layer to form a first electrode contact part, and a second electrode connected to the active layer, wherein the first electrode contact part is connected to the first electrode by the first via;

wherein the active layer comprises a semiconductor part in electrical contact with the second electrode, and a first electrode contact part in electrical contact with the semiconductor part;

wherein the semiconductor part of the active layer comprises one of a source region and a drain region, the first electrode contact part serves as another of the source region and the drain region, and a channel is sandwiched between the source region and the drain region, wherein a lateral edge of the gate, a lateral edge of the gate insulating layer, and a lateral edge of the source region or the drain region in the semiconductor part facing away from the channel of the semiconductor part are aligned with each other.

19. The TFT of claim 1, wherein the lateral edge of the source region or the drain region in the semiconductor part is in electrical contact with the second electrode at a lateral edge of the second electrode aligned with both the lateral edge of the gate and the lateral edge of the gate insulating layer.

20. The TFT of claim 1, wherein the first electrode is a drain electrode, the second electrode is a source electrode, the first electrode contact part serves as the drain region, a portion of the semiconductor part disposed between the channel and the second electrode serves as the source region; and the first electrode contact part is directly connected to the first electrode through the first via.

* * * * *